TRANSISTOR PULSE TRANSMISSION CIRCUITS

Filed Oct. 20, 1955 4 Sheets-Sheet 1

INVENTOR
J. J. SCANLON
BY R. B. Ardis
ATTORNEY

TRANSISTOR PULSE TRANSMISSION CIRCUITS

Filed Oct. 20, 1955 4 Sheets-Sheet 2

INVENTOR
J. J. SCANLON
BY R. B. Ardis
ATTORNEY

Sept. 29, 1959 J. J. SCANLON 2,906,891

TRANSISTOR PULSE TRANSMISSION CIRCUITS

Filed Oct. 20, 1955 4 Sheets-Sheet 3

INVENTOR
J. J. SCANLON
BY
R. B. Ardis
ATTORNEY

INVENTOR
J. J. SCANLON
BY R. B. Ardis
ATTORNEY 2,906,891

TRANSISTOR PULSE TRANSMISSION CIRCUITS

John J. Scanlon, Denville, N.J., assignor to Bell Telephone Laboratories, Incorporated, New York, N.Y., a corporation of New York Application October 20, 1955, Serial No. 541,637

17 Claims. (Cl. 307—88.5)

This invention relates generally to transistor circuits for the transmission of short pulses of direct current and more particularly, although in its broader aspects not exclusively, to junction transistor circuits for use in parallel type digital computers.

In a parallel binary adder, addition in each of the digit stages may take place substantially simultaneously if there is no delay in the transmission of carry pulses from one stage to the next. When such a delay does exist, the operating speed of the adder is determined, at least to a first approximation, by the time required for a carry pulse to be transmitted all the way through the chain of digit stages. It is, therefore, desirable to reduce the time delay involved in the transmission of a carry pulse through each stage to substantially zero if the maximum operating speed possibilities of a parallel binary adder are to be realized.

In the past, the carry chain of a parallel binary adder has generally been composed of a series of gate circuits arranged so that each stage triggers the next. This practice has presented no insuperable problems with vacuum tubes employed as the active gating elements, thanks largely to the extremely short turn-on times of such devices. When it is attempted to use transistors, however, particularly those of the junction type, it is found that their relatively longer turn-on times tend to introduce a substantial delay in the transmission of a carry pulse from one stage to the next and to slow down the operation of the adder to a serious extent.

Copending application Serial No. 410,924, filed February 17, 1954, by P. A. Reiling, discloses a junction transistor gating device which normally has a high impedance in the internal transistor collector-emitter path but which has a low impedance in that path whenever the emitter junction is given the proper direct voltage bias. Such gating devices have been used chiefly to sample portions of an alternating or direct voltage applied across the collector and emitter electrodes of the transistor. Sampling pulses applied between the transistor emitter and base electrodes have been used to control the condition of the gate. Since the sampled voltage is applied continuously, no problem arises with respect to delay imposed in the collector-emitter path while switching takes place. When it is attempted to control the transmission of short pulses of direct current through the internal collector-emitter path of a transistor by means of control pulses applied to the base electrode, however, the same delay found in junction transistor circuits of the relaxation type tends to be encountered.

A principal object of the invention, therefore, is to eliminate as nearly as possible the time delay involved in transmitting a pulse of direct current through a junction transistor gate circuit.

A closely related object is to transmit a short pulse of direct current through a long chain of junction transistor gate circuits with substantially no cumulative time delay.

Another object is to permit junction transistors to be used as the active gating elements in the carry chain of a parallel binary adder without slowing down the speed of operation of the adder.

Still another object is to control the transmission of pulses of direct current in as simple a manner as possible with direct-current pulses of much smaller amplitude.

In a principal aspect, the invention takes the form of a gate circuit for short pulses of direct current which includes a junction transistor, means to couple the direct-current pulses for transmission to the transistor collector electrode, an external capacitor coupling carriers from the transistor collector electrode to the transistor base electrode, and output means connected to the transistor emitter electrode. When the steep leading edge of an applied direct-current pulse of the proper polarity reaches the transistor collector electrode, a large number of carriers are injected into the base through the initial low impedance provided by the capacitor. Since the emitter junction of the transistor presents a low impedance to a direct-current pulse of this polarity, the leading edge of the pulse is transmitted substantially instantaneously to the output side of the gate. At the same time, the carriers injected into the transistor base diffuse to the region of the collector and are collected, resulting in transistor action which provides a low impedance in the internal collector-base path of the transistor. This low impedance persists long enough to permit passage of the entire pulse through to the transistor emitter electrode.

In another important aspect, the invention takes the form of a gate circuit for short pulses of direct current, as described above, which features means to block the transmission of pulses between the transistor collector and emitter electrodes in the absence of a control pulse and means permitting transmission in the manner described in the presence of a control pulse. In accordance with this feature of the invention, the emitter junction of the transistor is biased in the reverse direction by a potential substantially equal in magnitude to and reversed in polarity from the maximum potential of the signal pulse which is applied to the transistor collector electrode in the absence of a control pulse and has substantially no emitter bias in the presence of a control pulse. The reverse emitter bias prevents the carriers coupled into the transistor base through the external capacitor from initiating transistor action and, as a result, transmission of the body of the signal pulse is blocked, preventing spurious transmission of signal pulses in the absence of a control pulse. When a control pulse removes the reverse emitter bias, the gate functions in the manner which has been described.

In accordance with another important feature of the invention, a direct-current signal pulse applied to the collector electrode of the above-described junction transistor gate is carefully synchronized with the control pulse governing the condition of bias of the emitter junction. The signal pulse has its leading edge trailing the leading edge of the control pulse by at least the rise time of the control pulse permitting the reverse emitter bias to be completely removed prior to the arrival at the transistor collector electrode of the leading edge of the signal pulse. Precision control of the gate circuit is thereby provided and transmission failures which might otherwise tend to occur even though signal and control pulses coincide in time are thereby avoided.

In still another aspect, the present invention is a junction transistor carry chain suitable for use in a parallel type digital computer which introduces substantially no cumulative time delay in its operation. In accordance with the invention, a plurality of junction transistors are arranged with their internal collector-emitter paths connected in tandem to form a series chain, an external capacitor is connected between the collector and base electrodes of each of the transistors, each emitter junction is provided with a reverse bias to block transmission, a direct-current control pulse is applied simultaneously to each transistor to remove the reverse emitter bias, and a direct-current carry pulse, synchronized with the control pulse so that the carry pulse overlaps at least a part of the control pulse in time and has its leading edge trailing the leading edge of the control pulse by at least the rise time of the control pulse, is applied to the collector electrode of the first transistor in the chain. When the carry pulse is applied to the first transistor, it finds the reverse emitter bias removed and, through the combination of the initial low external capacitor impedance and transistor action resulting from the carriers injected into the transistor base, is transmitted through to the next transistor and so on throughout the length of the chain with substantially no time delay.

From a somewhat different point of view, the present invention may be considered to take the form of a logical And circuit, which produces an output pulse when, and only when, all of its plurality of input terminals are energized. In this form, the invention features a plurality of junction transistors arranged with their internal collector-emitter paths forming a series chain, an external capacitor connected between the collector and emitter electrodes of each of the transistors, a first source of regularly spaced pulses of direct current and means to apply them to the collector of the first stage, means for biasing each emitter junction in the reverse direction to block transmission of pulses from the first source, and a second source of pulses of direct current synchronized with the first source and means to apply them selectively and simultaneously to each of the transistors to remove the reverse emitter bias. The emitter electrode of the last stage forms the output terminal and the emitter biasing circuits of the respective stages the input circuits. The pulses from the second source are timed to lead those from the first source in the manner featured by the invention and, when all input circuits are energized, the chain passes the appropriate pulse all the way from the first source to the emitter electrode of the final stage, where it constitutes the output pulse of the And circuit.

A more complete understanding of the invention in its various aspects may be obtained from a study of the following detailed description of a number of specific embodiments. In the drawings.

Figure 6:
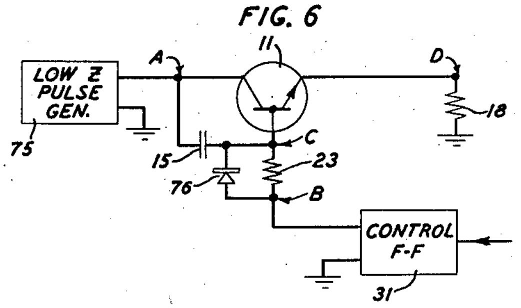
Fig. 6 illustrates a synchronous pulse power amplifier embodying features of the present invention.
Figure 7:
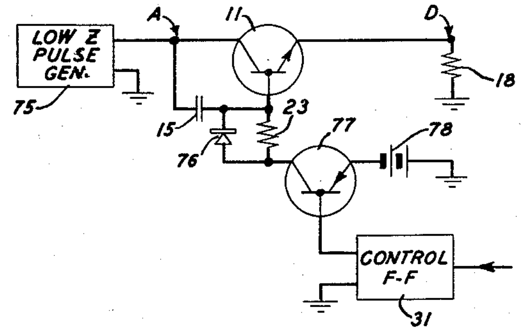
Figure 8A:
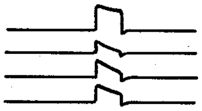
Figure 8B:
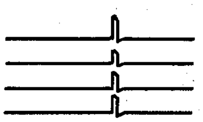
Figure 8C:
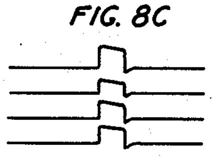
Figure 8D:
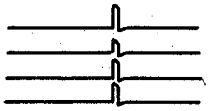

Figs. 6A, 6B, 6C, and 6D depict waveforms illustrating the performance of the embodiment of the invention illustrated in Fig. 6;

Fig. 7 is a variation of the synchronous pulse power amplifier shown in Fig. 6;

Figs. 8A and 8B show waveforms illustrating another aspect of the performance of the embodiment of the invention shown in Fig. 6; and Figs. 8C and 8D show waveforms corresponding to those of Figs. 8A and 8B of the embodiment of the invention illustrated in Fig. 7.

Figure 1:
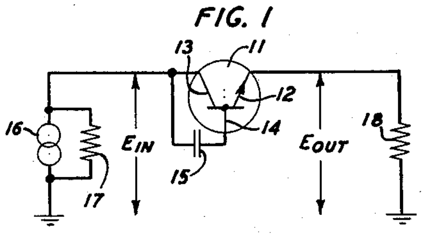
Fig. 1 illustrates an embodiment of the invention adapted to pass short pulses of direct current with substantially no time delay.

The embodiment of the invention shown in Fig. 1 is an instantaneous transmission circuit for short pulses of direct current which includes a junction transistor 11 of the n-p-n type which has an emitter electrode 12, a collector electrode 13, and a base electrode 14. In the conventional transistor symbol used, the arrow is used to designate the emitter electrode and is pointed in the direction of positive emitter current flow. For the n-p-n transistor shown in Fig. 1, the emitter arrow is directed away from the base. Since its positive emitter current flow is in the opposite direction, a p-n-p transistor would be designated by a symbol in which the arrow points toward the base. Either type of transistor may be used, although n-p-n transistors are shown throughout most of the present drawings for the sake of consistency.

In the embodiment of the invention illustrated in Fig. 1, an external capacitor 15, supplementing the parasitic collector-base capacity of transistor 11, is connected directly between collector electrode 13 and base electrode 14. A source 16 of direct-current signal pulses is connected between collector electrode 13 and ground. A small resistor 17 which may, by way of example, be of the order of 50 ohms in magnitude is connected across source 16 to give it a low impedance as seen from transistor 11. A load resistor 18 is connected between emitter electrode 12 and ground. No direct-current connection is made to base electrode 14.

Figure 1A:
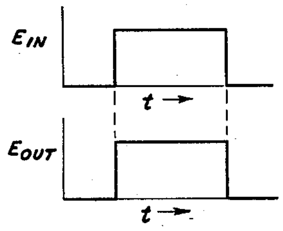
Fig. 1A shows the input and output waveforms of the embodiment of the invention illustrated in Fig. 1.

As shown in the top line of Fig. 1A, the pulse of direct current applied by pulse generator 16 to the collector electrode of transistor 11 is a positive-going pulse which tends to bias the collector junction in the reverse direction. Since the collector junction would normally present a high impedance to such a pulse, it might be thought that no output would appear at transistor emitter electrode 12. The embodiment of the invention shown in Fig. 1, however, transmits the input pulse instantaneously to load resistor 18 in the transistor emitter circuit, as shown in the second line of Fig. 1A, which suggests that the internal collector to emitter path of the transistor presents a low impedance to the pulse. The amplitude of the output pulse is determined by the ratio of the emitter load resistance to the sum of the emitter load resistor and the internal collector to emitter impedance of the transistor.

Figure 2:
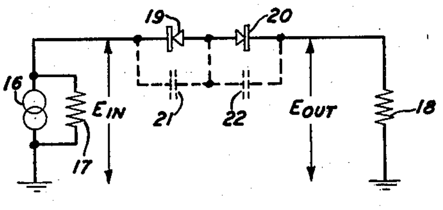
Fig. 2 illustrates a circuit arrangement used in the explanation of the mode of operation of the embodiment of the invention illustrated in Fig. 1.
Figure 2A:
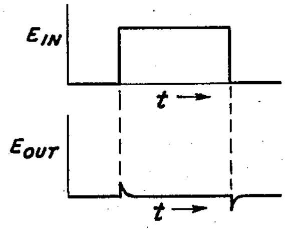
Fig. 2A shows the input and output waveforms of the circuit illustrated in Fig. 2.

In the absence of a direct-current base connection as in Fig. 1, it might be considered that the n-p-n transistor 11 could be represented by a pair of back-to-back diodes 19 and 20 connected in the manner shown in Fig. 2, where the collector diode 19 is poled in the reverse direction and the emitter diode 20 in the forward direction with respect to the positive-going pulse applied to the collector. Collector diode 19 is shown shunted by a parasitic capacity 21, while emitter diode 20 is shown shunted by a parasitic capacity 22. However, if this were a true representation of the action of transistor 11 in Fig. 1, the output appearing across load resistor 18 due to the presence of a pulse on the collector would be as shown in the lower waveform in Fig. 2A, which is a representation of the capacitive pips which would be expected if only the coupling through parasitic capacities 21 and 22 were involved.

As shown in the lower waveform of Fig. 1A, however, transmission resulting from a positive-going direct-current input pulse is an instantaneous and exact replica of the input pulse. It follows, therefore, that there is another phenomenon involved in addition to capacity coupling. This phenomenon is transistor action and is made possible by a principal feature of the present invention.

The transistor action is provided by the large collector to base capacity featured by the present invention (inherent capacity enhanced to a considerable extent by external capacity) which couples a large pulse of current into the base because of the fast rise time of the signal pulse. This action is somewhat similar to that which produces the capacitive pips shown in the second line of Fig. 2A for the back-to-back diodes. When the diodes are embodied in a transistor, however, the pulse of current injects a large number of carriers into the base, most of which diffuse to the region of the collector and are collected to give transistor action.

In the embodiment of the invention shown in Fig. 1, the emitter junction of transistor 11 presents a low impedance to a positive-going pulse of direct current at the collector, while the collector junction presents a high impedance. In the absence of the external capacitor 15 featured by the present invention, therefore, transmission through the internal collector-emitter path of transistor 11 is blocked. Capacitor 15, however, presents a low impedance to the steep leading edge of the incoming signal pulse and couples carriers (positive charges for the n-p-n transistor illustrated in Fig. 1) from collector electrode 13 to base electrode 14. Transistor action takes place as these carriers are collected and preserves the low impedance in the emitter-base path for a time long enough to pass the rest of the signal pulse. Since the emitter junction presents a low impedance to the signal pulse, the pulse passes on through the internal collector-emitter path of the transistor without delay. External capacitor 15 provides the initial low impedance for the sharp leading edge of the signal pulse and transistor action takes over and provides a low impedance for the reremainder.

From another point of view, the action of external capacitor 15 in the embodiment of the invention illustrated in Fig. 1 may be regarded as providing an initial low impedance for the leading edge of the positive-going signal pulse and, by virtue of the positive charge coupled to the base, thereby providing a momentary forward bias for the emitter electrode of transistor 11. The collector-emitter impedance of transistor 11 is thereby switched to its low impedance condition to pass the body of the pulse, the switching being completed by the time the initial transient through external capacitor 15 dies away.

Figure 3:
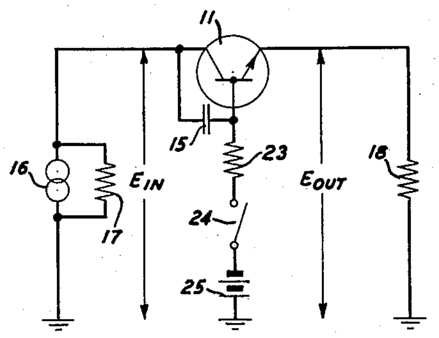
Fig. 3 represents a junction transistor gate circuit embodying the present invention.

A junction transistor gate circuit embodying the invention and featuring means for alternately blocking and permitting the passage of signal pulses is shown in Fig. 3. The circuit is the same as that of Fig. 1 but includes, in addition, a resistor 23, a switch 24, and a direct potential source 25 connected in series between the base electrode of transistor 11 and ground. Potential source 25 provides a bias approximately equal in magnitude to the amplitude of the direct-current signal pulses applied to the collector electrode of transistor 11 and is poled to bias the emitter junction in the reverse direction. As illustrated, the base electrode of transistor 11 is held at a negative potential when the switch 24 is closed, but is left floating at other times.

Figure 3A:
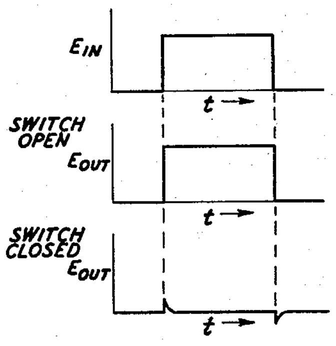
Fig. 3A shows input and output waveforms for two different switch positions in the embodiment of the invention depicted in Fig. 3.

Fig. 3A illustrates the operation of the junction transistor gate circuit shown in Fig. 3. The top line illustrates a positive-going pulse of direct current applied to the transistor collector electrode, the middle line illustrates the output pulse produced at the transistor emitter electrode with switch 24 open, and the bottom line illustrates the output produced at the transistor emitter electrode with switch 24 closed. As shown, the transmission with switch 24 open is the same as that illustrated in Fig. 1A, while that with switch 24 closed is substantially zero, with only capacitive pips appearing at the leading and trailing edges of the applied pulse because of the parasitic capacities of the transistor.

Junction transistors of the p-n-p type may, as has already been noted, be used in this and other embodiments of the invention instead of those of the n-p-n type. For transistors of the p-n-p type, however, battery and diode polarities should be reversed from those shown and the pulses supplied by signal pulse source 16 should be negative-going instead of positive-going.

Figure 4:
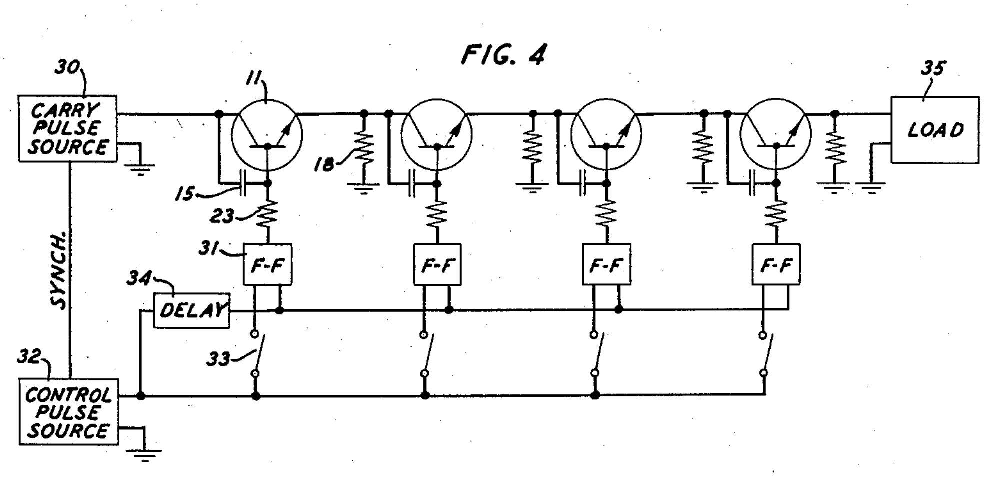
Fig. 4 illustrates an embodiment of the invention which, depending upon the point of view, is either a fast carry system for a parallel binary adder or a logical And circuit.

From one important point of view, the embodiment of the invention shown in Fig. 4 may be regarded as a fast carry chain suitable for use in such parallel type digital computer circuits as binary adders. Four stages are shown in the cain by way of example although either a larger or a smaller number could be used, depending upon the number of digit stages used in the adder or other computer circuit with which it is associated.

The illustrated example is an adaptation of the embodiment of the invention shown in Fig. 3. The first stage includes a junction transistor of the n-p-n type having an external capacitor 15 connected between its collector and base electrodes. The remaining stages are the same as the first, with the internal collector-emitter paths of the successive transistors forming a series chain. A direct-current carry pulse source 30 is provided with its output terminals connected between the collector electrode of the first transistor 11 in the chain and ground. The base of each transistor is connected through a resistor 23 to the output terminal of a flip-flop circuit 31. Each flip-flop circuit 31 has a first output state, corresponding to the closed position of switch 24 in Fig. 3 and providing a reverse emitter bias for the transistor comparable in magnitude to the carry pulse supplied from source 30, and a second output state, corresponding to the open position of switch 24 in Fig. 3 and providing substantially no emitter bias. By way of example, each flip-flop circuit 31 has two input terminals, one serving to trigger it from its first output state to its second output state when energized and the other serving to return it to its first output state.

In the embodiment of the invention illustrated in Fig. 4, a direct-current control pulse source 32, synchronized with carry pulse source 30, is connected through a respective switch 33 to the input terminal of each flip-flop circuit 31 triggering the latter from its first to its second ouput state. Source 32 is also connected to each of the remaining input terminals of flip-flop circuits 31 through a pulse delay network 34. A load resistor 18 is returned to ground from the collector electrode of each transistor, and a load or utilization circuit 35 is connected across the final load resistor of the fast carry chain.

In operation, carry pulse source 30 and control pulse source 32 in the embodiment of the invention illustrated in Fig. 4 are synchronized so that each control pulse leads the corresponding carry pulse by at least the rise time of the control pulse. The control pulse is applied simultaneously and selectively through the control switches 33 to one terminal of each of the respective flip-flop circuits 31 and triggers the latter from their first state, providing a reverse transistor emitter bias, to their second state, providing substantially no emitter bias. When all switches in the chain are closed and the reverse emitter bias removed from all transistors, the carry pulse finds the junction transistor in condition for substantially instantaneous transmission. In each transistor in succession, the leading edge of the carry pulse is passed by the external collector-base capacitor 15 and initiates transistor action. Transistor action in turn switches the internal transistor collector-emitter impedance to a low level in time to transmit the remainder of the pulse. In this manner, the carry pulse passes down the length of the chain with virtually no time delay and no distortion. The control pulse applied by delay circuit 34 is then applied to the remaining flip-flop circuit terminals and returns the flip-flop circuits to their first output state, biasing each transistor emitter junction in the reverse direction. If, in the operation of the circuit, any control switch 33 should be left open, the particular transistor gate with which it is associated would remain closed and transmission down the chain blocked.

Although the embodiment of the invention of Fig. 4 is shown with flip-flop circuits 31 controlling the conditions of the respective transistor gates, they are not absolutely essential. The same result can be obtained, by way of example, by providing control pulse source 32 with a negative bias and supplying its output directly through switches 33 to the respective resistors 23. Each transistor emitter junction would be reverse biased in the absence of a direct-current control pulse from source 32. A control pulse would then cause the transistor base to rise towards ground, eliminating the emitter bias.

It is important to note at this point that the fast carry chain shown in Fig. 4 may also be operated by making each flip-flop circuit 31 provide zero bias in the absence of a control pulse and a negative or shut-off bias in the presence of a control pulse. When operated in this manner, carry pulses from source 30 are transmitted through the chain only in the absence of a control pulse and are blocked in the presence of a control pulse. Synchronization between control and carry pulses is, in accordance with an important feature of the invention, the same as has been described except that now for full transmission, the trailing edge of the control pulse is timed to lead the leading edge of the carry pulse by at least the decay time of the control pulse. Fundamentally, this type of operation differs little from that which has previously been described, since the selection of a reference point to use in recognizing either the presence or the absence of a pulse is a matter of choice in many instances.

From another point of view, the embodiment of the invention shown in Fig. 4 may be regarded not as a fast carry chain for use in a parallel binary adder but as a logical And circuit, in which the emitter electrode of the final transistor stage is the output terminal and the input electrode of each flip-flop circuit 31 connected to switch 33 is an input terminal. Carry pulse source 30 and control pulse source 32 continue to function in the manner described, although the term "carry" no longer has its former significance. Input pulses are applied to the various stages by closing the respective switch 33 and, when all switches 33 are closed, a control pulse is applied to each flip-flop circuit simultaneously. Under such conditions, each transistor is provided with zero emitter bias in time for the correct "carry" pulse to be transmitted completely through the chain and provide an output pulse. If one or more of the switches 33 is left open, i.e., no input is supplied to the corresponding transistor, the "carry" pulse is blocked and no output is produced.

Figure 5:
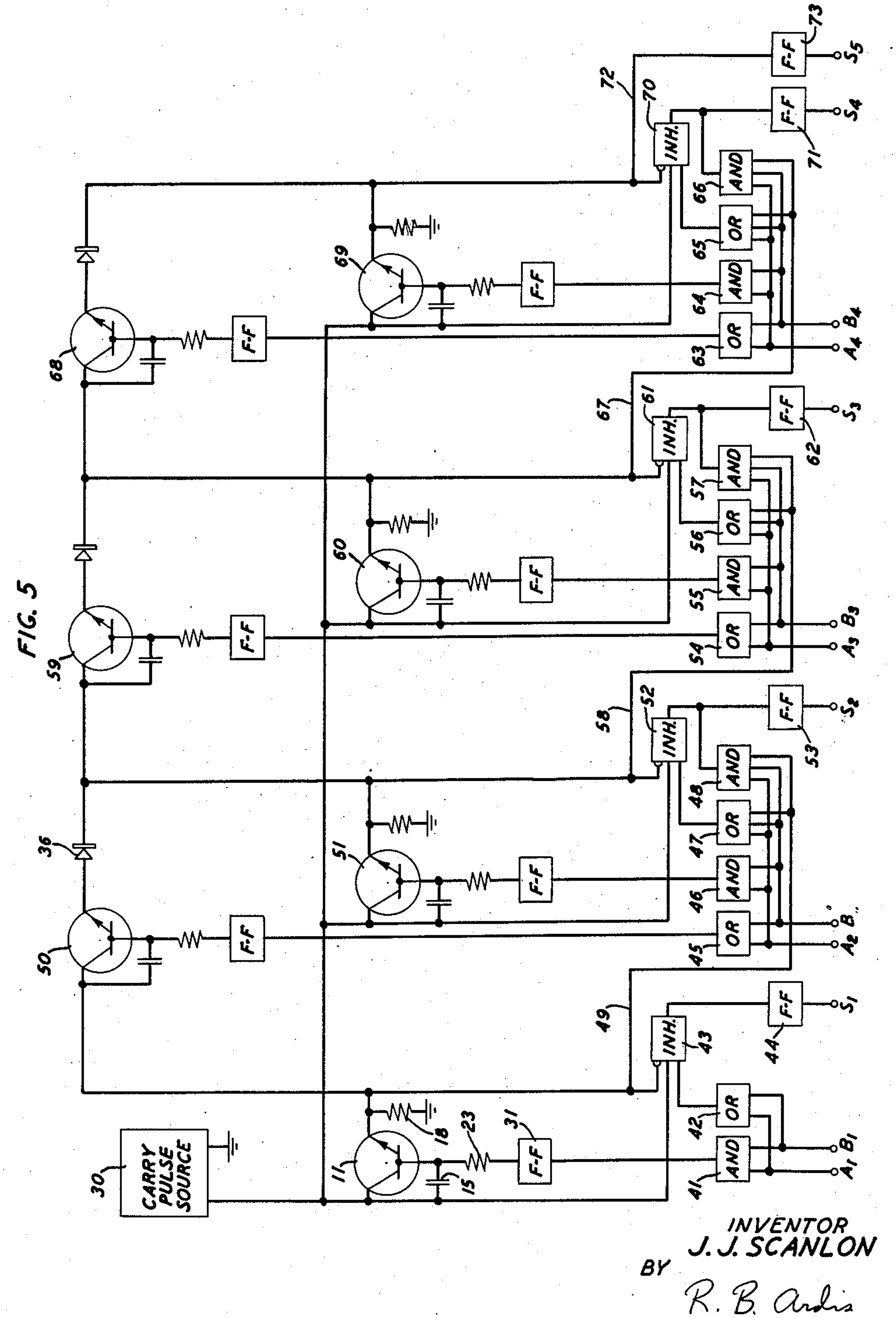
Fig. 5 shows a complete parallel binary counter featuring a junction transistor fast carry system embodying the present invention.

The parallel binary adder shown in partial block diagram form in Fig. 5 incorporates a junction transistor carry system embodying the present invention. By way of example, it is arranged to handle four-digit binary numbers but could be given an enlarged capacity simply by increasing the number of digit stages. Four stages, however, serve as well as a greater number of stages to illustrate the principles involved and the advantages provided by the invention.

The basic logic elements in the parallel binary adder of Fig. 5 are shown as boxes for the sake of simplicity. These include the And, Or, and Inh (for inhibition) circuits and may, by way of example, be similar to those illustrated on pages 424 and 425 of the book "Principles of Transistor Circuits," edited by R. F. Shea and published in 1953 by John Wiley and Sons. Of these circuits, the Or circuit will have an output when any one of its input terminals is energized and the And circuit will have an output only if all of its input terminals are energized. The Inh or inhibition circuit, on the other hand, is an And circuit with means for preventing a signal from appearing at its output as long as there is a signal on its inhibiting input lead. In addition, a number of additional flip-flop circuits (F–F) are shown. These may be any standard transistor bistable or flip-flop circuits and are preferably provided with "clock" reset pulses which either restore them to or retain them in their zero current conditions at predetermined intervals (see, e.g., U.S. Patent 2,670,445, issued February 23, 1954, to J. H. Felker).

The various signal input and output terminals of the parallel adder in Fig. 5 are labeled according to the following notation:

$$\begin{array}{ccccc} & A_4 & A_3 & A_2 & A_1 \\ & B_4 & B_3 & B_2 & B_1 \\ \hline S_5 & S_4 & S_3 & S_2 & S_1 \end{array}$$

where the A figures represent the augend; the B figures the addend, and the S figures the sum. In this conventional binary representation, the least significant bit is on the right in each instance. In the actual adder illustrated in Fig. 5, the digit stages are in the reverse order, with the stage representing the least significant bit on the left, so that the circuit operation may be described in an orderly left-to-right fashion.

At the lower left-hand corner of Fig. 5, the terminals $A_1$ and $B_1$ are shown connected to both an And circuit 41 and an Or circuit 42. The output of And circuit 41 is coupled to the base of a junction transistor gate 11 like those in the embodiment of the invention illustrated in Fig. 4, while the output of Or circuit 42 is connected to a non-inhibiting input terminal of an inhibition circuit 43. A carry pulse source 30 like that in Fig. 4 has one output terminal grounded and the other connected to the collector electrode of transistor gate 11. In addition, the undergrounded output terminal of carry pulse source 30 is connected to another non-inhibiting input terminal of inhibition circuit 43. The inhibiting input terminal of inhibition circuit 43 is connected to the emitter of gate 11 and its single output is connected through a flip-flop circuit 44 to sum terminal $S_1$, which registers the least significant bit of the sum of the added binary numbers.

The second digit stage of the parallel adder is somewhat similar to the first but includes additional logic elements. Terminals $A_2$ and $B_2$, which receive the next least significant bits of the augend and addend respectively, are connected to an Or circuit 45, an And circuit 46, an Or circuit 47, and an And circuit 48. In addition, a local carry lead 49 is connected between the emitter of junction transistor gate 11 and additional inputs of Or circuit 47 and And circuit 48. The output of Or circuit 45 is coupled to the base of junction transistor gate 50, while the output of And circuit 46 is coupled to the base of junction transistor gate 51. Gates 50 and 51 are substantially the same as gate 11 and have their emitter electrodes connected together to the inhibiting input lead of inhibition circuit 52. The emitter electrode of transistor gate 11 is connected to the collector electrode of gate 50, while the high potential side of carry pulse source 30 is connected to the collector electrode of gate 51 and to the non-inhibiting input terminal of inhibition circuit 52. The output of Or circuit 47 is connected to another non-inhibiting input of inhibition circuit 52 and the outputs of both inhibition circuit 52 and And circuit 48 are connected through a flip-flop circuit 53 to sum terminal $S_2$ which registers the next least significant bit of the sum of the added binary numbers.

The third digit stage is substantially the same as the second. Input terminals $A_3$ and $B_3$ are connected to an Or circuit 54, an And circuit 55, an Or circuit 56 and an And circuit 57. As in the preceding stage, the local carry lead 58 is connected between the emitter electrode of gate 51 and additional inputs of Or circuit 56 and And circuit 57. The output of Or circuit 54 is coupled to the base of another juncture transistor gate 59, while the output of And circuit 55 is coupled to the base of a junction transistor gate 60. The collector of gate 59 is connected to the emitter of preceding gate 50 (with, by way of example, diode 36, poled in the direction of positive emitter current flow in gate 50 connected in between for isolation purposes) and the collector of gate 60 is connected to the high potential side of carry pulse source 30. The emitter electrodes of junction transistor gates 59 and 60 are connected together to the inhibiting input terminal of inhibition circuit 61 and the non-inhibiting inputs of inhibition circuit 61 are supplied, respectively, from Or circuit 56 and the high potential side of carry pulse source 30. The outputs of And circuit 57 and inhibition circuit 61 are connected through a flip-flop circuit 62 to sum terminal $S_3$.

The final digit stage of the parallel adder is the same as the second and third stages. Augend and addend bit input terminals $A_4$ and $B_4$ are connected to an Or circuit 63 an And circuit 64, an Or circuit 65, and an And circuit 66. The local carry lead 67 from the previous stage is connected between the emitter electrode of gate 60 and additional inputs of Or circuit 65 and And circuit 66. The outputs of Or circuit 63 and And circuit 64 are coupled to the base electrodes of junction transistor gates 68 and 69, respectively. The emitter electrode of the transistor gate 59 in the preceding stage is connected to the collector electrode of gate 68, while the high potential side of carry pulse source 30 is connected to both the collector electrode of gate 69 and a non-inhibiting input terminal of inhibition circuit 70. The emitter electrodes of gates 68 and 69 are connected together to the inhibiting input terminal of inhibition circuit 70, and the respective outputs of And circuit 66 and inhibition circuit 70 are connected through a flip-flop circuit 71 to sum terminal $S_4$. In addition, a final local carry lead 72 is connected from the emitter electrode of gate 60 through a flip-flop circuit 73 to the final sum terminal $S_5$.

In accordance with the present invention, the parallel binary adder which has just been described actually includes a number of the fast carry chains illustrated in Fig. 4 superimposed upon one another. One fast carry chain, for example, is made up of gates 11, 50, 59, and 68. Another comprises gates 51, 59, and 68, while still another includes gates 60 and 68. Substantially instantaneous transmission of a carry pulse when permitted by the logic circuits is, in accordance with the invention, provided by the capacitor 15 connected between the collector and base electrodes of each junction transistor gate and by synchronization between carry pulse source 30 and the application of the augend and addend digits to the respective adder input leads. The augend and addend digits are supplied simultaneously and are timed to have their leading edges out in front of the leading edge of the corresponding carry pulse by at least their respective rise times. When appropriate, as determined by the logic elements, each gate is thereby permitted to transmit the carry pulse through the chain with substantially no cumulative time delay. The resulting fast carry permits all digit stages of the adder to function substantially simultaneously and the full speed advantages of the parallel type circuit to be realized even though junction transistors are employed as the active gating elements.

The detailed functioning of the parallel binary adder embodying the present invention and illustrated in Fig. 5 may best be described by means of Table I, which shows the state of the output of each of the various elements in binary form. The following four numerical examples are used:

*Example 1*

A 0 0 1 1
B 1 1 0 1

S 1 0 0 0 0

*Example 2*

A 0 1 1 1
B 1 1 0 1

S 1 0 1 0 0

*Example 3*

A 0 0 1 1
B 1 0 1 1

S 1 1 1 0

*Example 4*

A 0 1 1 0
B 1 1 0 0

S 1 0 0 1 0

In the table, the indicated fast carry gate output is that at the transistor emitter electrode. Each registered output digit is underlined for ease of reference.

TABLE I

| Element | Ex. 1 | Ex. 2 | Ex. 3 | Ex. 4 |
|---|---|---|---|---|
| Carry pulse source 30 | 1 | 1 | 1 | 1 |
| Input $A_1$ | 1 | 1 | 1 | 0 |
| Input $B_1$ | 1 | 1 | 1 | 0 |
| And circuit 41 | 1 | 1 | 1 | 0 |
| Or circuit 42 | 1 | 1 | 1 | 0 |
| Fast carry gate 11 | 1 | 1 | 1 | 0 |
| Inh circuit 43 | 0 | 0 | 0 | 0 |
| Output $S_1$ | $\underline{0}$ | $\underline{0}$ | $\underline{0}$ | $\underline{0}$ |
| Input $A_2$ | 1 | 1 | 1 | 1 |
| Input $B_2$ | 0 | 0 | 1 | 0 |
| Or circuit 45 | 1 | 1 | 1 | 1 |
| And circuit 46 | 0 | 0 | 1 | 0 |
| Or circuit 47 | 1 | 1 | 1 | 1 |
| And circuit 48 | 0 | 0 | 1 | 0 |
| Fast carry gate 50 | 1 | 1 | 1 | 0 |
| Fast carry gate 51 | 0 | 0 | 1 | 0 |
| Inh circuit 52 | 0 | 0 | 0 | 1 |
| Output $S_2$ | $\underline{0}$ | $\underline{0}$ | $\underline{1}$ | $\underline{1}$ |
| Input $A_3$ | 0 | 1 | 0 | 1 |
| Input $B_3$ | 1 | 1 | 0 | 1 |
| Or circuit 54 | 1 | 1 | 0 | 1 |
| And circuit 55 | 0 | 1 | 0 | 1 |
| Or circuit 56 | 1 | 1 | 1 | 1 |
| And circuit 57 | 0 | 1 | 0 | 0 |
| Fast carry gate 59 | 1 | 1 | 0 | 0 |
| Fast carry gate 60 | 0 | 1 | 0 | 1 |
| Inh circuit 61 | 0 | 0 | 1 | 0 |
| Output $S_3$ | $\underline{0}$ | $\underline{1}$ | $\underline{1}$ | $\underline{0}$ |
| Input $A_4$ | 0 | 0 | 0 | 0 |
| Input $B_4$ | 1 | 1 | 1 | 1 |
| Or circuit 63 | 1 | 1 | 1 | 1 |
| And circuit 64 | 0 | 0 | 0 | 0 |
| Or circuit 65 | 1 | 1 | 1 | 1 |
| And circuit 66 | 0 | 0 | 0 | 0 |
| Fast carry gate 68 | 1 | 1 | 0 | 1 |
| Fast carry gate 69 | 0 | 0 | 0 | 0 |
| Inh circuit 70 | 0 | 0 | 1 | 0 |
| Output $S_4$ | $\underline{0}$ | $\underline{0}$ | $\underline{1}$ | $\underline{0}$ |
| Output $S_5$ | $\underline{1}$ | $\underline{1}$ | $\underline{0}$ | $\underline{1}$ |

The speed of operation of the illustrated adder is particularly dependent upon the present invention in Examples 1 and 2 of the above table, which represent situations in which a carry pulse is transmitted through junction transistor gates 11, 50, 59, and 68 in succession. Since the present invention permits such transmission with substantially no time delay, the addition in the corresponding digit stages of the adder is permitted to be carried on substantially simultaneously. A carry pulse is not transmitted through quite such long chains in Examples 3 and 4 because of the operation of the logic circuits, but application of the principles of the invention still permits faster operation of the adder. In Example 3, for instance, a carry pulse is transmitted through transistor gates 11 and 50 in succession, while in Example 4 it is transmitted through transistor gates 60 and 68.

From still another aspect, the present invention may be considered to take the form of a synchronous pulse power amplifier such as that illustrated in Fig. 6. The embodiment of the invention shown in Fig. 6 includes a junction transistor 11 having an external capacitor 15 interconnecting its collector and base electrodes, a low impedance direct-current pulse generator 75 connected between its collector electrode and ground, and a load resistor 18 connected between its emitter electrode and ground. A resistor 23 and a control flip-flop circuit 31 corresponding to those in Figs. 4 and 5 are connected between the base electrode of transistor 11 and ground, with flip-flop circuit 31 providing a reverse emitter bias for transistor 11 in the absence of a pulse at its input and substantially no emitter bias in the presence of such a pulse. Resistor 23 is shunted by a diode 76 poled toward the transistor base electrode in order to provide a low impedance and hence a fast discharge path for capacitor 15. Pulse generator 75 provides a regularly spaced succession of positive-going pulses of direct current.

The series of waveforms illustrated in Figs. 6A through 6D shows the performance of the embodiment of the invention of Fig. 6 for the following set of component values:

| | |
|---|---|
| Transistor 11 | 1853 type (n-p-n). |
| Capacitor 15 | 200 micromicrofarads. |
| Resistor 18 | 1600 ohms. |
| Resistor 23 | 9100 ohms. |

The waveforms in each figure correspond to the waveforms at the indicated points of the circuit of Fig. 6. The input transmission pulse at point A is shown in the top line of each figure, the input control pulse at point B is shown in the second line, the base to ground waveform at point C is shown in the third line, and the output transmission pulse at point D is shown in the bottom line.

Figure 6A:
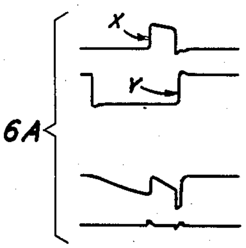
Figure 6B:
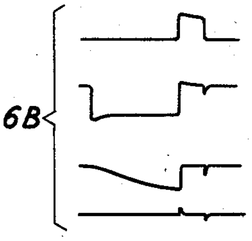
Figure 6C:
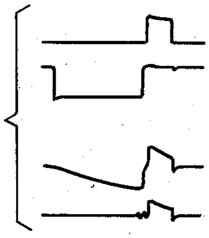
Figure 6D:
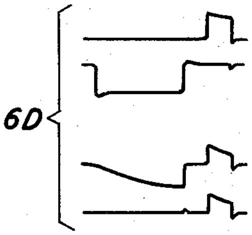

The series of waveforms in Figs. 6A through 6D illustrates the effect on the transmission of a one microsecond pulse from pulse generator 75 of the relative timing of the leading edge of the input pulse (at X) and the leading edge of the control pulse (at Y). Fig. 6A shows the input transmission pulse completely leading the control pulse from flip-flop circuit 31. There is no transmission through to the emitter. Fig. 6B shows the leading edge of the input transmission pulse coincident with the leading edge of the control pulse and again there is no transmission. Fig. 6C shows the leading edge of the transmission pulse coincident with the end of the control pulse leading edge rise interval. This time there is partial transmission amounting to about 80 percent of the ultimate. Fig. 6D shows the leading edge of the transmission pulse lagging the leading edge of the control pulse by approximately a microsecond. This time there is substantially full transmission.

The feature of the invention relating to the timing of the transmission pulse at A relative to the control pulse at B is particularly well demonstrated by Figs. 6B and 6C. In Fig. 6B, although the two pulses are coincident, there is no transmission since the leading edge of the transmission pulse is not able to inject the large pulse of current into the base necessary to provide transistor action and hence transmission. In Fig. 6C, the leading edge of the control pulse is only about 0.2 of a microsecond earlier in time than in Fig. 6B but, since its rise time is over before the leading edge of the transmission pulse occurs, the latter can inject carriers into the base to produce transistor action and the resulting transmission.

It should be noted at this point that while the output from flip-flop circuit 31 has been referred to as a pulse, there is no necessity that the pulse be a short one. It may, in fact, be considerably longer than the pulses from generator 75. The principal limitation is that if only a single output pulse is to be produced at D, the pulse at B should not overlap more than one pulse at A. The pulse at B may be longer if it is desired to produce two or more output pulses at D for each control pulse applied to flip-flop circuit 31.

A variation of the embodiment of the invention of Fig. 6 in which provision is made to minimize loss of output during transmission caused by diversion of collector to base capacitor pulse current through resistor 23 is the synchronous pulse power amplifier illustrated in Fig. 7. The amplifier in Fig. 7 is the same as that in Fig. 6 except that a second transistor 77 is inserted between resistor 23 and control flip-flop circuit 31. Transistor 77 is of the opposite conductivity type from transistor 11 and has its collector electrode connected to resistor 23, its base electrode connected to flip-flop circuit 31, and its emitter electrode returned to ground through a direct potential source 78. Potential source 78 is poled to bias the emitter electrodes of both transistors 77 and 11 in the reverse direction.

In the operation of the circuit illustrated in Fig. 7, as long as the output of flip-flop circuit 31 remains negative the potential supplied by source 78 is overcome and the emitter junction of transistor 77 is forward biased. The collector-emitter impedance of transistor 77 is low and the base electrode of transistor 11 is held at a negative potential. This has the effect of reverse biasing the emitter junction of transistor 11 and keeping the main transistor gate in its open condition. When an incoming control pulse triggers flip-flop circuit 31 to its zero output state, potential source 78 takes over and reverse biases the emitter junction of transistor 77. The collector-emitter path of transistor 77 is thereby switched to its high impedance condition and the effect of source 78 on the emitter junction of transistor 11 is eliminated, causing the main transistor gate to close.

The comparative performance of the circuits of Figs. 6 and 7 for different values of the collector to base capacitor 15 is shown in Figs. 8A through 8D. Figs. 8A and 8B represent the circuit of Fig. 6 while Figs. 8C and 8D represent that of Fig. 7. In each figure the top waveform illustrates the positive-going input transmission pulse at point A and the remaining waveforms illustrate resulting output pulses at point D. The second waveform represents the output for no external capacitor 15, the third for an external capacitor 15 of 75 micromicrofarads, and the fourth for an external capacitor 15 of 200 micromicrofarads. Figs. 8A and 8C both illustrate the performance for a one microsecond pulse while Figs. 8B and 8D illustrate the performance of a pulse 0.2 of a microsecond in length.

As illustrated in Figs. 8A through 8D, the arrangement of Fig. 6 tends to favor short pulses. Leading edge amplitude is substantially the same for a given value of capacitor 15 for either circuit arrangement. For the longer pulses, however, in the circuit of Fig. 6 the amplitude of the output pulse falls off with time. One explanation of this is that the output pulse is composed of two components. The leading edge is the direct capacitive spike of current from capacitor 15 in the forward direction through the emitter diode. This original spike of emitter current injects carriers into the base which diffuse and are collected to produce the rest of the output. In Fig. 6, some of the initial base current is diverted but, since the generator 75 is essentially constant voltage, this does not influence the leading edge of the output wave. The diversion path does, however, drain off some of the carriers injected into the base, making them unavailable for collection and reducing the transistor action with time.

The embodiments of the invention illustrated in Figs. 6 and 7 are not amplifiers in the conventional sense. They can, however, be used to control the transfer of relatively large amounts of pulse power from the collector to the emitter load by means of small charges applied to the base, thus giving a large amount of effective gain. The amount of charging current for control may be very small, with the minimum being determined by the size of capacitor 15, the voltage to which capacitor 15 is to be charged, and the time available for charging. The maximum repetition rate for generator 75 is determined by the maximum time required to charge capacitor 15 under the existing circuit conditions.

It is to be understood that the above-described arrangements are illustrative of the application of the principles of the invention. Numerous other arrangements may be devised by those skilled in the art without departing from the spirit and scope of the invention.

What is claimed is:

1. A fast carry system which comprises a plurality of transistors each having an emitter electrode, a collector electrode and a base electrode, circuit means connecting the internal transistor paths between a pair of said electrodes in tandem transmission relation to form a series chain, a capacitor connected to couple carries from one of said pair of electrodes to the remaining said electrode of each of said transistors, a source of a two-state direct-current control signal, circuit means to apply said control signal to said remaining electrode of each of said transistors, each of said transistors being biased to provide a high impedance between its said pair of electrodes during one state of said control signal and having substantially no bias during the other state of said control signal, a source of a direct-current carry pulse synchronized with said control signal, said carry pulse overlapping at least a portion of the latter state of said control signal in time and having its leading edge trailing the leading edge of said latter state of said control signal, circuit means to apply said carry pulse to said one of said pair of electrodes of the first transistor at one end of said chain for transmission through each of said transistors in succession, and utilization means connected to the other of said pair of electrodes of the last transistor at the other end of said chain, whereby said carry pulse is transmitted from said carry pulse source through each of said transistors in succession to said utilization means with substantially no delay.

2. A fast carry system which comprises a plurality of transistors each having an emitter electrode, a collector electrode and a base electrode, circuit means connecting the internal collector-emitter paths of said transistors in tandem transmission relation to form a series chain, a capacitor connected to couple carriers from the collector to the base electrode of each of said transistors, a source of a direct-current control pulse, circuit means to apply said control pulse between the base and emitter electrodes of each of said transistors, each of said transistors having a reverse emitter bias in the absence of said control pulse and substantially no emitter bias in the presence of said control pulse, a source of a direct-current carry pulse synchronized with said control pulse, said carry pulse overlapping at least a portion of said control pulse in time and having its leading edge trailing the leading edge of said control pulse, circuit means to apply said carry pulse to the collector electrode of the first transistor at one end of said chain for transmission through each of said transistors in succession, and utilization means connected to the emitter electrode of the last transistor at the other end of said chain, whereby said carry pulse is transmitted from said carry pulse source through each of said transistors in succession to said utilization means with substantially no delay.

3. A fast carry system in accordance with claim 2 in which the leading edge of said carry pulse trails the leading edge of said control pulse by at least the rise time of said control pulse.

4. A fast carry system which comprises a plurality of transistors each having an emitter electrode, a collector electrode and a base electrode, circuit means connecting the internal collector-emitter paths of said transistors in tandem transmission relation to form a series chain, a capacitor connected to couple carriers from the collector to the base electrode of each of said transistors, a flip-flop circuit associated with each of said transistors and having its output connected between the base and emitter electrodes thereof, each of said flip-flop circuits having a first output state biasing the respective transistor emitter electrode in the reverse direction and a second output state providing substantially no transistor emitter bias, a source of a control pulse, circuit means to apply said control pulse to said flip-flop circuit to trigger it from its said first output state to its said second output state, said flip-flop circuit remaining in its said first output state in the absence of said control pulse, a source of a direct-current carry pulse synchronized with said control pulse, said carry pulse having its leading edge trailing the leading edge of said control pulse, circuit means to apply said carry pulse to the collector electrode of the first transistor at one end of said chain for transmission through each of said transistors in succession, and utilization means connected to the emitter electrode of the last transistor at the other end of said chain, whereby said carry pulse is transmitted from said carry pulse source through each of said transistors in succession to said utilization means with substantially no delay.

5. A logical And circuit which comprises a plurality of transistors each having an emitter electrode, a collector electrode, and a base electrode, circuit means connecting the internal transistor paths between a pair of said electrodes in tandem transmission relation to form a series chain, a capacitor connected to couple carriers from one of said pair of electrodes to the remaining said electrode of each of said transistors, means to apply a first pulse of direct current selectively and simultaneously to the said remaining electrode of each of said transistors, each of said transistors being biased to provide a high impedance between its said pair of electrodes in the absence of said first pulse, a source of a second pulse of direct current synchronized with said first pulse, said second pulse overlapping at least a portion of said first pulse in time and having its leading edge trailing the leading edge of said first pulse, and circuit means to apply said second pulse to one of said pair of electrodes of the first transistor at one end of said chain for transmission through each of said transistors in succession, whereby said second pulse is passed through each of said transistors in succession with substantially no delay and appears at the other of said pair of electrodes of the last transistor at the other end of said chain only if said first pulse is applied to all of said transistors in said chain.

6. A logical And circuit which comprises a plurality of transistors each having an emitter electrode, a collector electrode, and a base electrode, circuit means connecting the internal collector-emitter paths of said transistors in tandem transmission relation to form a series chain, a capacitor connected to couple carriers from the collector to the base electrode of each of said transistors, means to apply a first pulse of direct current selectively and simultaneously between the base and emitter electrodes of each of said transistors, each of said transistors having a reverse emitter bias in the absence of said first pulse and substantially no emitter bias in the presence of said first pulse, a source of a second pulse of direct current synchronized with said first pulse, said second pulse overlapping at least a portion of said first pulse in time and having its leading edge trailing the leading edge of said first pulse, and circuit means to apply said second pulse to the collector electrode of the first transistor at one end of said chain for transmission through each of said transistors in succession, whereby said second pulse is passed through each of said transistors in succession with substantially no delay and appears at the emitter electrode of the last transistor at the other end of said chain only if said first pulse is applied to all of said transistors in said chain.

7. A gate circuit with substantially zero time delay which comprises a transistor having an emitter electrode, a collector electrode, and a base electrode, a capacitor connected to couple carriers from one to the other of a first pair of said electrodes, a source of a two-state direct-current control signal, circuit means to apply said control pulse to said transistor between a second pair of said electrodes, said transistor being biased to provide a high impedance between a third pair of said electrodes during one state of said control signal and having substantially no bias during the other state of said control signal, a source of a direct-current signal pulse synchronized with said control signal, said signal pulse overlapping at least a portion of the latter state of said control signal in time and having its leading edge trailing the leading edge of said latter state of said control signal, circuit means to apply said signal pulse to one of said third pair of electrodes for transmission through said transistor to the other of said third pair of electrodes, and output means connected to said other of said third pair of electrodes.

8. A gate circuit with substantially zero time delay which comprises a junction transistor having an emitter electrode, a collector electrode, and a base electrode, a capacitor connected to couple carriers from said collector to said base electrode, a source of a direct-current control pulse, circuit means to apply said control pulse to said transistor between said base and emitter electrodes, said transistor having a reverse emitter bias in the absence of said control pulse and substantially no emitter bias in the presence of said control pulse, a source of a direct-current signal pulse synchronized with said control pulse, said signal pulse overlapping at least a portion of said control pulse in time and having its leading edge trailing the leading edge of said control pulse, circuit means to apply said signal pulse to said collector electrode for transmission through said transistor to said emitter electrode, and output means connected to said emitter electrode.

9. A gate circuit in accordance with claim 8 in which the leading edge of said signal pulse trails the leading edge of said control pulse by at least the rise time of said control pulse.

10. A gate circuit with substantially zero time delay which comprises a junction transistor having an emitter electrode, a collector electrode, and a base electrode, a capacitor connected to couple carriers from said collector to said base electrode, a flip-flop circuit having its output connected between said base and emitter electrodes, said flip-flop circuit having a first output state biasing the emitter junction of said transistor in the reverse direction and a second output state providing substantially no emitter bias, a source of a control pulse, circuit means to apply said control pulse to said flip-flop circuit to trigger it from its said first output state to its said second output state, said flip-flop circuit remaining in its said first output state in the absence of a control pulse, a source of a direct-current signal pulse synchronized with said control pulse, said signal pulse having its leading edge trailing the leading edge of said control pulse, circuit means to apply said signal pulse to said collector electrode for transmission through said transistor to said emitter electrode, and output means connected to said emitter electrode.

11. A gate circuit which comprises a transistor having an emitter electrode, a collector electrode, and a base electrode, a capacitor connected between a first and a second of said electrodes to couple carriers from said first electrode to said second electrode, means to apply a direct-current signal pulse to said first electrode for transmission through said transistor to the remaining one of said electrodes, means connected between said second electrode and said remaining electrode to bias said transistor to provide a high impedance between said first electrode and said remaining electrode, means to substantially eliminate said bias, and output means connected to said remaining electrode.

12. A gate circuit which comprises a transistor having an emitter electrode, a collector electrode, and a base electrode, a capacitor connected between said collector and base electrodes to couple carriers from said collector electrode to said base electrode, means to supply a direct-current signal pulse to said collector electrode for transmission through said transistor to said emitter electrode, means connected between said base and emitter electrodes to bias said emitter electrode in the reverse direction, means to substantially eliminate said reverse emitter bias, and output means connected to said emitter electrode.

13. An synchronous pulse power amplifier which comprises a transistor having an emitter electrode, a collector electrode, and a base electrode, a capacitor connected to couple carriers from a first to a second of said electrodes, a source of regularly spaced direct-current pulses of relatively high power, means coupling pulses from said source to said first electrode for transmission through said transistor to the third of said electrodes, output means connected to said third electrode, and means to apply direct-current signal pulses of relatively low power to said second electrode in substantial synchronism with said pulses from said source, said transistor being biased to provide a high impedance between its said first and third electrodes in the absence of a signal pulse and having substantially no bias in the presence of a signal pulse, whereby a pulse of relatively high power from said source is passed through said transistor between said first and third electrodes to said output means whenever a signal pulse is applied to said second electrode.

14. A synchronous pulse power amplifier which comprises a junction transistor having an emitter electrode, a collector electrode, and a base electrode, a capacitor connected to couple carriers from said collector to said base electrode, a source of regularly spaced direct-current pulses of relatively high power, means coupling pulses from said source to said collector electrode for transmission through said transistor to said emitter electrode, output means connected to said emitter electrode, and means to apply direct-current signal pulses of relatively low power between said base and emitter electrodes in substantial synchronism with said pulses from said source, said transistor having a reverse emitter bias in the absence of a signal pulse and substantially no bias in the presence of a signal pulse, whereby a pulse of relatively high power from said source is passed through said transistor between said collector and emitter electrodes to said output means whenever a signal pulse is applied between said base and emitter electrodes.

15. A synchronous pulse power amplifier which comprises a junction transistor having an emitter electrode, a collector electrode, and a base electrode, a capacitor connected to couple carriers from said collector to said base electrode, a source of regularly spaced direct-current pulses of relatively high power, means coupling pulses from said source to said collector electrode for transmission through said transistor to said emitter electrode, output means connected to said emitter electrode, a flip-flop circuit having its output connected between said base and emitter electrodes, said flip-flop circuit having a first output state biasing the emitter junction of said transistor in the reverse direction and a second output state providing substantially no emitter bias, and means to apply signal pulses of relatively low power to said flip-flop circuit to trigger it from its said first output state to its said second output state, said flip-flop circuit remaining in its said first output state in the absence of a control pulse, whereby a pulse of relatively high power from said source is passed through said transistor between said collector and emitter electrodes to said output means whenever a signal pulse is applied between said base and emitter electrodes.

16. A synchronous pulse power amplifier which comprises a first transistor having an emitter electrode, a collector electrode, and a base electrode, a capacitor connected to couple carriers between the collector and base electrodes of said first transistor, a source of regularly spaced direct-current pulses of relatively high power, means coupling pulses from said pulse source to the collector electrode of said first transistor for transmission through said transistor to said emitter electrode, output means connected to the emitter electrode of said first transistor, a second transistor having an emitter electrode, a collector electrode, and a base electrode, a source of direct potential poled to bias the emitter electrodes of both said transistors in the reverse direction, the collector-emitter path of said second transistor and said potential source being connected in series between the base and emitter electrodes of said first transistor, and means to apply direct-current signal pulses of relatively low power between the base and emitter electrodes of said second transistor, said second transistor having a forward emitter bias in the absence of a signal pulse and a reverse emitter bias in the presence of a signal pulse and said first transistor having a reverse emitter bias in the absence of a signal pulse and a forward emitter bias in the presence of a signal pulse, whereby a pulse of relatively high power from said pulse source is passed through the collector-emitter path of said first transistor to said output means whenever a signal pulse is applied between the base and emitter electrodes of said second transistor, and diversion of carriers away from the base electrode of said first transistor is avoided.

17. A synchronous pulse amplifier in accordance with claim 16 in which said first and second transistors are of opposite conductivity type.

References Cited in the file of this patent

UNITED STATES PATENTS

| | | |
|---|---|---|
| 2,585,078 | Barney | Feb. 12, 1952 |
| 2,698,416 | Sherr | Dec. 28, 1954 |
| 2,722,649 | Immel et al. | Nov. 1, 1955 |
| 2,751,549 | Chase | June 19, 1956 |
| 2,760,087 | Felker | Aug. 21, 1956 |